United States Patent
Seo et al.

(10) Patent No.: US 6,883,061 B2
(45) Date of Patent: Apr. 19, 2005

(54) ELECTRONIC SYSTEM AND REFRESH METHOD

(75) Inventors: Jong-Cheul Seo, Suwon (KR); Jin-Ho So, Sungnam (KR); Hui-Chong Shin, Seoul (KR); Meoung-Cheol Nam, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 10/345,946

(22) Filed: Jan. 17, 2003

(65) Prior Publication Data

US 2003/0145163 A1 Jul. 31, 2003

(30) Foreign Application Priority Data

Jan. 25, 2002 (KR) .................. 10-2002-004464

(51) Int. Cl.[7] .............................................. G06F 12/16
(52) U.S. Cl. ...................................................... 711/106
(58) Field of Search ................................ 711/106, 167; 365/222

(56) References Cited

U.S. PATENT DOCUMENTS 5,761,703 A * 6/1998 Bolyn ........................ 711/106
6,542,959 B1 * 4/2003 Tabo ......................... 711/106
6,622,197 B1 * 9/2003 Kim .......................... 711/100

* cited by examiner

Primary Examiner—Hiep T. Nguyen
(74) Attorney, Agent, or Firm—Harness, Dickey & Pierce, P.L.C.

(57) ABSTRACT

An electronic system having a plurality of dynamic semiconductor memory devices and a refresh method for the same. The system comprises a plurality of dynamic semiconductor memory devices and a controller. Each of the dynamic semiconductor memory devices includes a storage device for storing a designated number designating an order for performing a refresh operation, a refresh enable signal generating circuit for generating a refresh enable signal in response to a refresh control command supplied from the controller and a delaying circuit for delaying the refresh enable signal by different time intervals determined by the designated number.

12 Claims, 7 Drawing Sheets

ELECTRONIC SYSTEM AND REFRESH METHOD

This U.S. non-provisional patent application claims priority under 35 U.S.C. §119 of Korean Patent Application 2002-4464 filed on Jan. 25, 2002, the entire contents of which are hereby incorporated by reference.

BACKGROUND OF THE INVENTION

1. Field of the Invention

The present invention relates to an electronic system including a semiconductor memory device and a method of refreshing the semiconductor memory device included in the electronic system.

2. Description of Related Art

In a conventional electronic system such as a memory board or a memory module including a plurality of dynamic semiconductor memory devices such as dynamic random access memory (DRAM), all the dynamic semiconductor memory devices included in the memory system are refreshed at the same time. Accordingly, there has been a problem that peak current is high during a refresh operation.

FIG. 1 is a block diagram of a memory system having a plurality of DRAMs in accordance with the conventional art. As shown in FIG. 1, the memory system includes a control device 10 and four slots M1, M2, M3, M4 each of which may receive a memory module.

Chip selection signals CSB1, CSB2, CSB3, CSB4 are applied to corresponding slots M1, M2, M3, M4, respectively. An inverted column address strobe signal CASB, an inverted row address strobe signal RASB and data DQ are applied to all of the slots M1, M2, M3, M4.

FIG. 2 illustrates how the signals are associated in the memory system of FIG. 1. The memory modules MM1, MM2, MM3, MM4 are received in corresponding slots M1, M2, M3, M4, (designated in FIG. 1) respectively. Each of the memory modules MM1, MM2, MM3, MM4 includes four DRAMs m1, m2, m3, m4 (although four is an exemplary number).

The DRAMs m1, m2, m3, m4 mounted on the memory module MM1 are connected in common to an inverted chip selection signal CSB1 as well as connected in common to the inverted column strobe signal CASB and the inverted row address strobe signal RASB. The data DQ1, DQ2, DQ3, DQ4 are applied to corresponding DRAMs m1, m2, m3, m4, respectively.

That is, the DRAMs m1, m2, m3, m4 in the same memory module are enabled in response to the same inverted chip selection signal of the inverted chip selection signals CSB1, CSB2, CSB3, CSB4 supplied from the control device 10. After the DRAMs m1, m2, m3, m4 are enabled, the data DQ1, DQ2, DQ3, DQ4 are transmitted thereto.

In general, during normal operation, an active command of the inverted row address strobe signal RASB is applied before a read/write command of the inverted column address strobe signal CASB is applied.

However, the read/write command of the inverted column address strobe signal CASB is applied to the system before the active command of the inverted row address strobe signal RASB to the memory system during a refresh operation. Accordingly, all the DRAMs m1–m4 in all the memory modules MM1–MM4 are refreshed at the same time. Therefore, peak current increases dramatically at this time.

FIG. 3 is a block diagram of internal circuits for performing the refresh operation in the system of FIG. 2. As shown in FIG. 3, the internal circuits include a memory cell array 20, a refresh enable signal generating circuit 22, a refresh counter 24 and a row address decoder 26.

The refresh enable signal generating circuit 22 detects when the inverted column address strobe signal CASB is applied before the inverted row address strobe signal RASB is applied and generates a refresh enable signal CBR.

The refresh counter 24 generates refresh address REFA in response to the refresh enable signal CBR. The row address decoder 26 generates word line selection signals WL1–WLk by decoding the refresh address REFA.

The memory cell array 20 is refreshed in response to the word line selection signals WL1–WLk. The word lines are selected in due order by the word line selection signals WL1–WLk, so that the memory cells connected to the word lines WL1–WLk are refreshed in word line selection order.

Japanese Patent Laid Open No. H11-134857 describes a solution to the problem that peak current increases during a refresh operation.

The conventional memory system of the Japanese Patent Laid Open No. H11-134857 discloses a memory system comprising a plurality of DRAMs and a decode chip having an address decoder for generating control signals to control the DRAMs. The decode chip further includes a refresh mode control circuit for determining a refresh mode based on control signals supplied from a microprocessor and generating a refresh control signal. The decode chip further includes a signal switching circuit for delaying in sequence control signals to be transmitted to the DRAMs when the refresh mode control circuit determines the refresh mode.

The conventional memory system determines the refresh mode in response to an inverted row address strobe signal RASB and an inverted column address strobe signal CASB. After determining the refresh mode, the conventional memory system generates a plurality of row address strobe signals to be applied to the corresponding DRAMs, respectively, in response to decoded signals generated by decoding address signals. Accordingly, the DRAMs in the memory system are refreshed in due order. However, in the conventional memory system, the refresh operation is controlled by the decode chip separately provided from the DRAMs, so that the configuration of the memory system is complicated.

SUMMARY OF THE INVENTION

In an exemplary embodiment, the present invention is directed to an electronic system including dynamic random access memory (DRAM) devices each of which are capable of reducing peak current consumption during refresh operation without using an additional external device.

In an exemplary embodiment, the present invention is directed to an electronic system, comprising: a plurality of dynamic semiconductor memory devices; and a controller for controlling the semiconductor memory devices, wherein each of the dynamic semiconductor memory devices includes: a storage device for storing designated numbers designating an order for performing a refresh operation, the designated numbers being supplied from the controller when the electronic system is initialized; a refresh enable signal generating circuit for generating a refresh enable signal in response to a refresh controlling command supplied from the controller; and delay means for delaying the refresh enable signal by different time intervals which are determined by the designated numbers.

In an exemplary embodiment, the present invention is directed to an electronic system, comprising: a plurality of dynamic semiconductor memory devices; and a controller for controlling the semiconductor memory devices, wherein each of the dynamic semiconductor memory devices includes: a storage device for storing a designated number designating an order for performing a refresh operation when the system is initialized; a decoder for generating a plurality of decoded signals by decoding the designated number; refresh enable signal generating means for generating a refresh enable signal in response to a refresh controlling command supplied from the controller; delaying means for delaying the refresh enable signal by a time interval which is determined by the designated number; switching means for transmitting the delayed refresh enable signal in response to the decoded signals; and refresh address generating means for generating a refresh address in response to an output signal output from the switching means.

In an exemplary embodiment, the present invention is directed to a method of refreshing an electronic system including a plurality of dynamic semiconductor memory devices and a controller for controlling operation of the dynamic semiconductor memory devices, comprising: storing a designated number designating an order for performing a refresh operation on each of the plurality of dynamic semiconductor memory devices; and performing the refresh operation on the plurality of dynamic semiconductor memory devices in an order related to the designated number when a refresh control command is applied from the controller during the refresh operation.

In an exemplary embodiment, the present invention is directed to an electronic system, comprising: a plurality of dynamic semiconductor memory devices, each of the dynamic semiconductor memory devices including a storage device for storing a designated number designating an order for performing a refresh operation, a refresh enable signal generating circuit for generating a refresh enable signal in response to a refresh controlling command, and delay means for delaying the refresh enable signal by a time interval which is determined by the designated number.

In an exemplary embodiment, the present invention is directed to an electronic system, comprising: a plurality of dynamic semiconductor memory devices, each of the dynamic semiconductor memory devices including a storage device for storing a designated number designating an order for performing a refresh operation, a decoder for generating a plurality of decoded signals by decoding the designated number, refresh enable signal generating means for generating a refresh enable signal in response to a refresh controlling command, delaying means for delaying the refresh enable signal by a time interval which is determined by the designated number, switching means for transmitting the delayed refresh enable signal in response to the decoded signals, and refresh address generating means for generating a refresh address in response to an output signal output from the switching means.

In an exemplary embodiment, the present invention is directed to a method of refreshing an electronic system, comprising: storing designated numbers designating an order for performing a refresh operation on each of a plurality of dynamic semiconductor memory devices; and performing the refresh operation on the plurality of dynamic semiconductor memory devices in an order related to the designated numbers when a refresh control command is applied from a controller during the refresh operation.

BRIEF DESCRIPTION OF THE DRAWINGS

For a more complete understanding of the present invention and the advantages thereof, reference is now made to the following descriptions taken in conjunction with the accompanying drawings, in which like reference numerals designate like elements, and in which.

DETAILED DESCRIPTION OF EXEMPLARY EMBODIMENTS

Reference will now be made in detail to exemplary embodiments of the present invention, example of which is illustrated in the accompanying drawings. Like reference in all the drawings designate the like elements.

Figure 4:
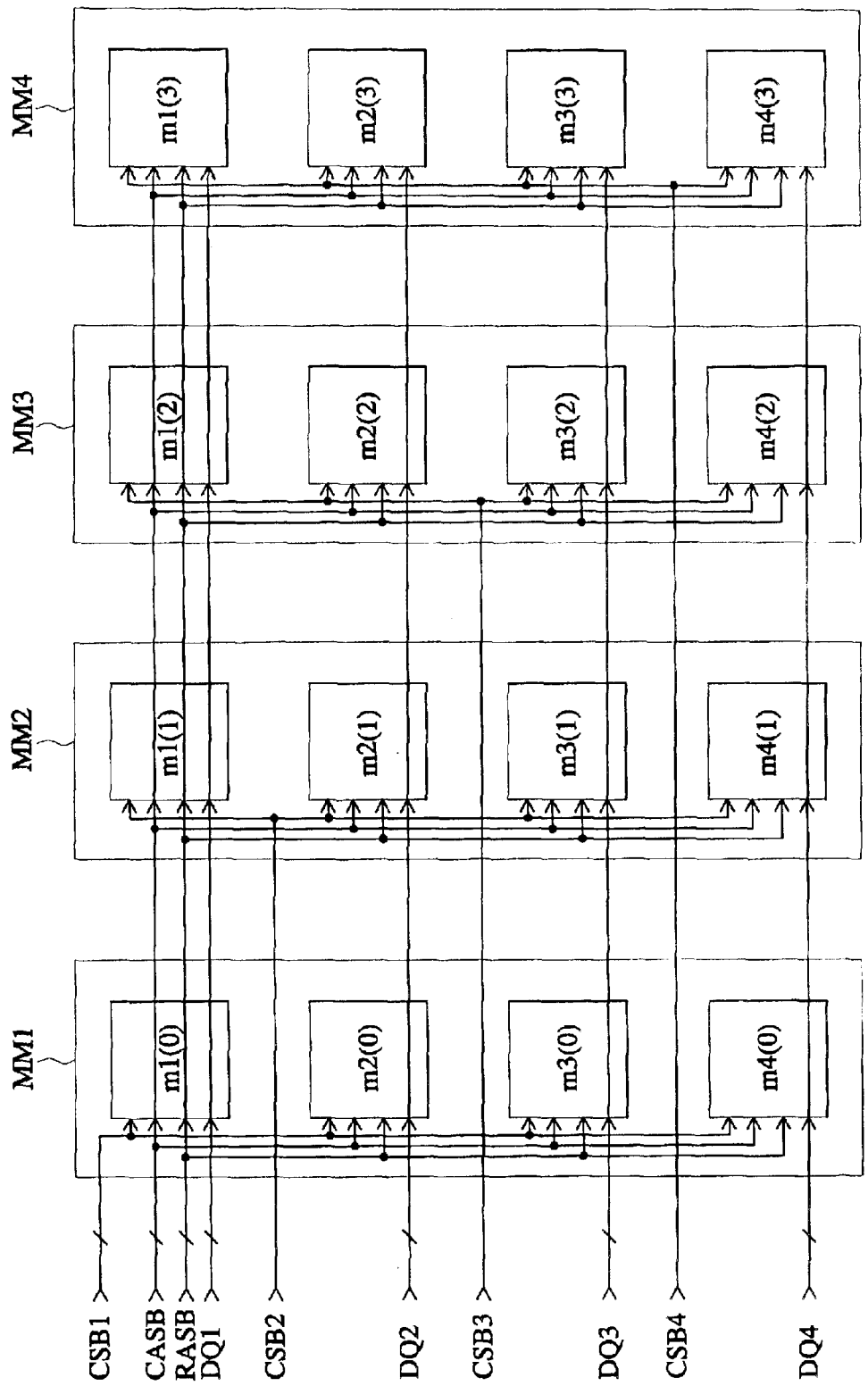
FIG. 4 is a block diagram of a system in accordance with an exemplary embodiment of the present invention, for showing how signals are connected or associated with each other.

FIG. 4 is a block diagram of a system having a plurality of memory modules including a plurality of dynamic semiconductor memory devices in accordance with an exemplary embodiment of the present invention.

Figure 1:
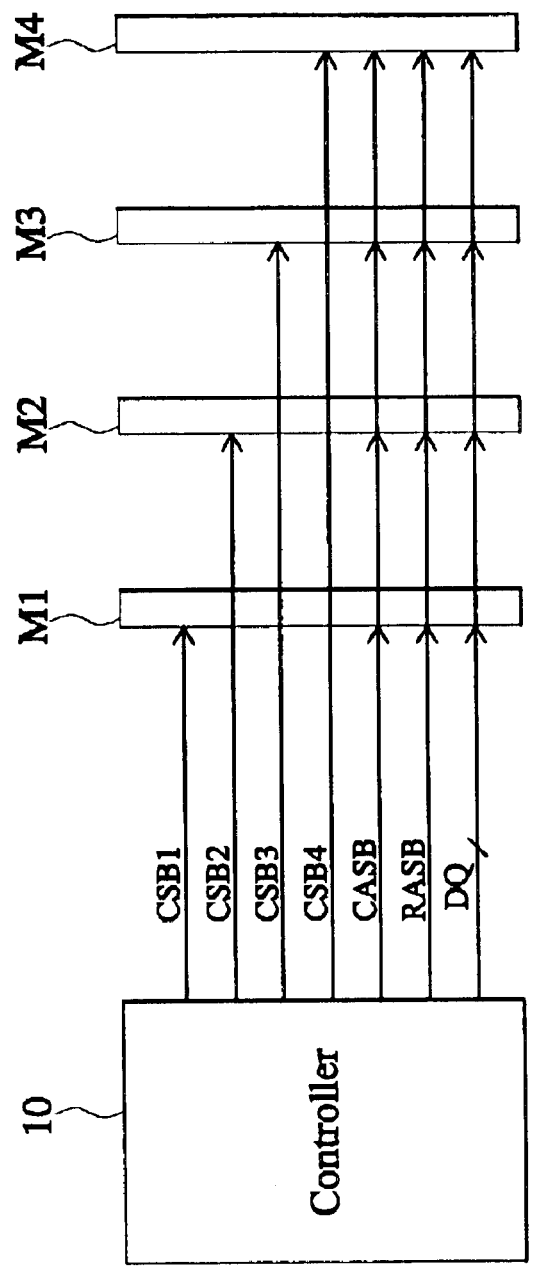
FIG. 1 is a block diagram of a memory system comprising a plurality of DRAMs in accordance with the conventional art.
Figure 2:
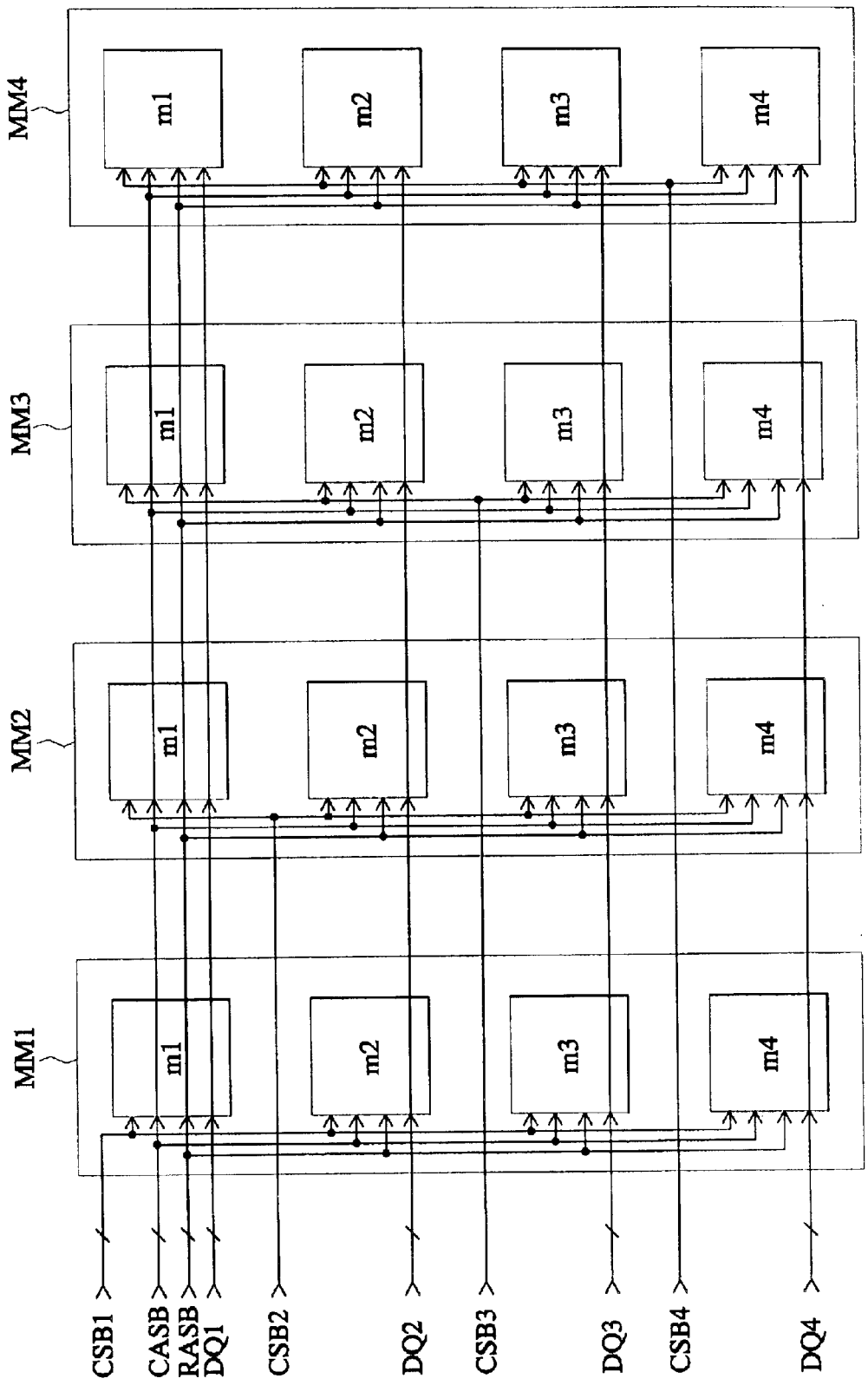
FIG. 2 is a block diagram of the memory system for showing how signals are connected or associated with each other in the memory system of FIG. 1 in accordance with the conventional art.
Figure 3:
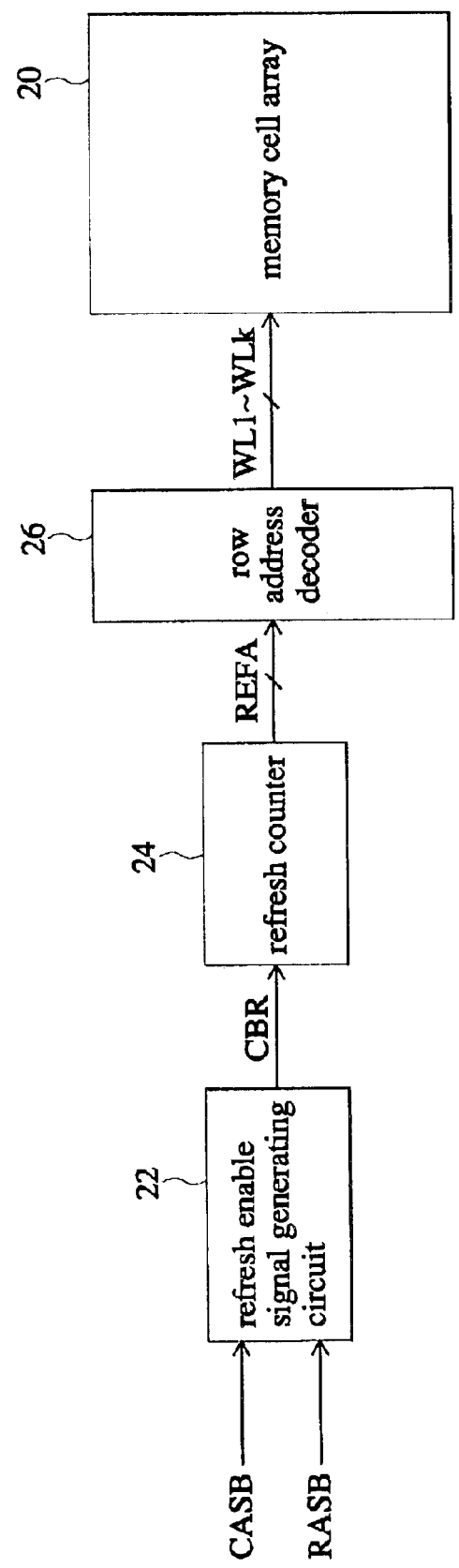
FIG. 3 is a block diagram showing internal circuitry for performing refresh operation in the memory system shown in FIG. 2 in accordance with the conventional art.

Signals are connected and associated with each other in the same manner as FIG. 2. However, each dynamic semiconductor memory device m1, m2, m3, m4 in each of memory modules MM1, MM2, MM3 MM4 stores its own designated number designating an order for performing the refresh operation, the number being designated by a controller (not shown).

In FIG. 4, numbers in round brackets are the designated numbers, each of which is stored in the corresponding dynamic semiconductor memory device and designates an order for performing the refresh operation. The dynamic semiconductor memory devices m1, m2, m3, m4 in the same memory module have the same designated number. For example, the dynamic semiconductor memory devices m1, m2, m3, m4 in the memory module MM1 store a designated number "0". The dynamic semiconductor memory devices m1, m2, m3, m4 in the memory module MM2 store a designated number "1". The dynamic semiconductor memory devices m1, m2, m3, m4 in the memory module MM3 store a designated number "2". The dynamic semiconductor memory devices m1, m2, m3, m4 in the memory module MM4 store a designated number "3".

Accordingly, the dynamic semiconductor memory devices included in the same memory module are refreshed at the same time. The designated number is stored in each of the dynamic semiconductor memory devices by the controller as described below.

As the system is initialized, the controller transmits the inverted chip selection signal CSB1 of a logic "low" level and the designated number "0" to the memory module MM1. The designated number "0" is transmitted to the memory module MM1 as the data DQ1, DQ2, DQ3, DQ4 through a plurality of data input output signal lines. Therefore, the designated number "0" is stored in all the dynamic semiconductor memory devices m1, m2, m3, m4 in the memory module MM1. Further, the controller transmits the inverted chip selection signal CSB2 and the designated number "1" as the data to the memory module MM2. Therefore, the designated number "1" can be stored in the dynamic semiconductor memory devices m1, m2, m3, m4 in the memory module MM2. In the same way, the designated number "2" is stored in dynamic semiconductor memory devices m1, m2, m3, m4 in the memory module MM3 and the designated number "3" is stored in dynamic semiconductor memory devices m1, m2, m3, m4 in the memory module MM4.

Figure 5:
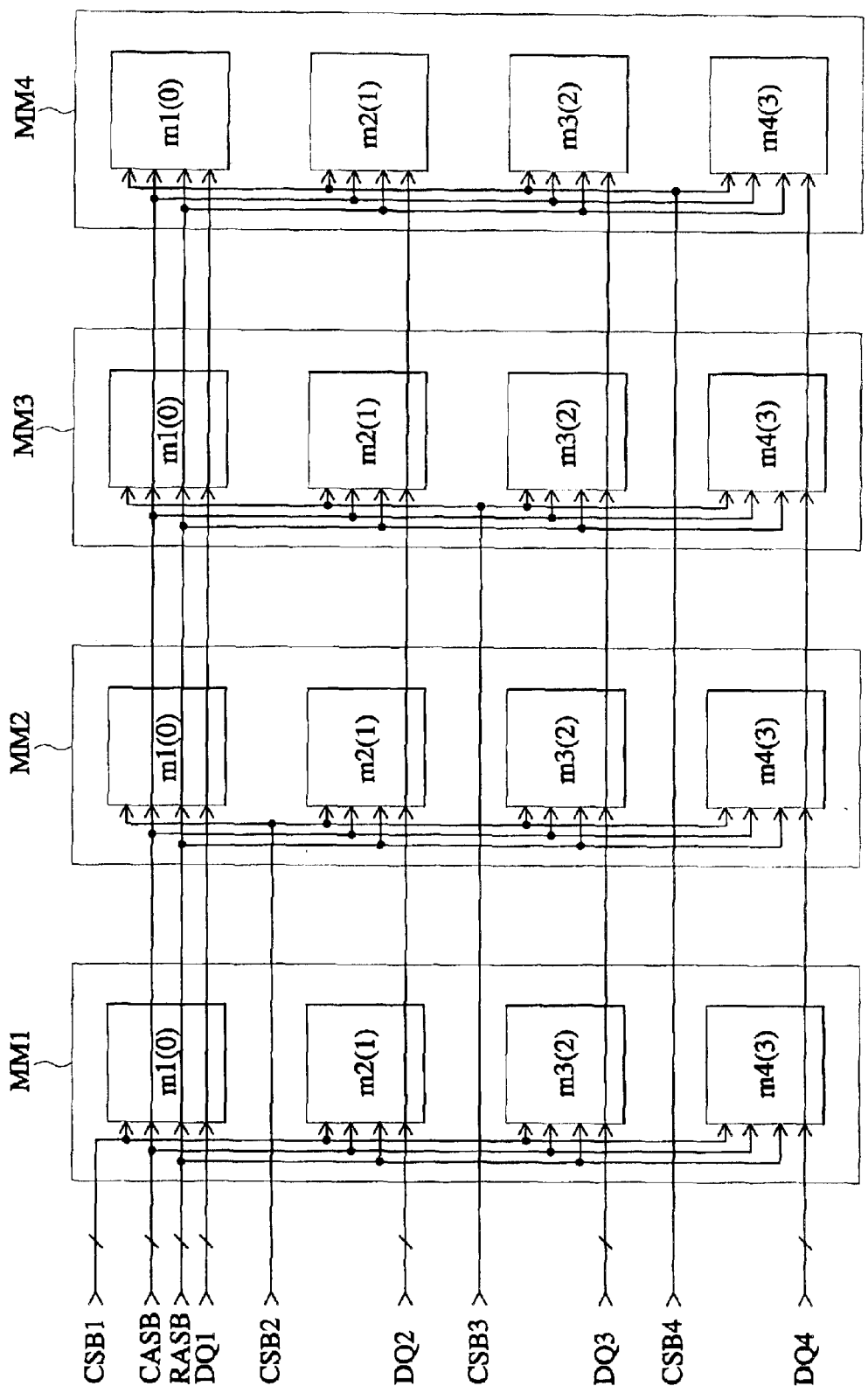
FIG. 5 is a block diagram of a system in accordance with another exemplary embodiment of the present invention, for showing how signals are connected or associated with each other.

FIG. 5 is a block diagram of a system in accordance with another exemplary embodiment of the present invention. Signals are connected and associated with each other in the same way of FIG. 2. However, each of dynamic semiconductor memory devices m1, m2, m3, m4 in memory modules MM1, MM2, MM3 MM4 stores its own designated number designating an order for performing the refresh operation, the number being designated by the controller.

In FIG. 5, numbers in round brackets are the designated numbers stored in the corresponding dynamic semiconductor memory devices and indicate an order for performing the refresh operation.

Each dynamic semiconductor memory device in the same memory module is designated with different number from each other. Accordingly, the dynamic semiconductor memory devices in the same memory module are not refreshed at the same time.

The dynamic semiconductor memory devices m1, m2, m3, m4 in each of the memory modules MM1, MM2, MM3, MM4 are designated with the designated number "0", "1", "2", "3", respectively, by the controller.

The controller 10 transmits the inverted chip selection signal CSB1 having a logic "low" level and the designated numbers "0", "1", "2", "3" as the data DQ1, DQ2, DQ3, DQ4 to the memory module MM1. Accordingly, the designated numbers "0", "1", "2", "3" are stored in the dynamic semiconductor memory devices m1, m2, m3, m4, respectively, in the memory module MM1

The controller transmits the inverted chip selection signal CSB2 having the logic "low" level and the designated numbers "0", "1", "2", "3" as the data DQ1, DQ2, DQ3, DQ4 to the memory module MM2. Accordingly, the designated numbers "0", "1", "2", "3" are stored in the dynamic semiconductor memory devices m1, m2, m3, m4, respectively, in the memory module MM2.

In the same way, the dynamic semiconductor memory devices m1, m2, m3, m4 in the memory modules MM3, MM4 store the designated numbers "0", "1", "2", "3", respectively.

As shown in FIGS. 4 and 5, the dynamic semiconductor memory devices in the memory modules MM1, MM2, MM3, MM4 can be designated with designated numbers in various way by the controller when the system is initialized.

Figure 6:
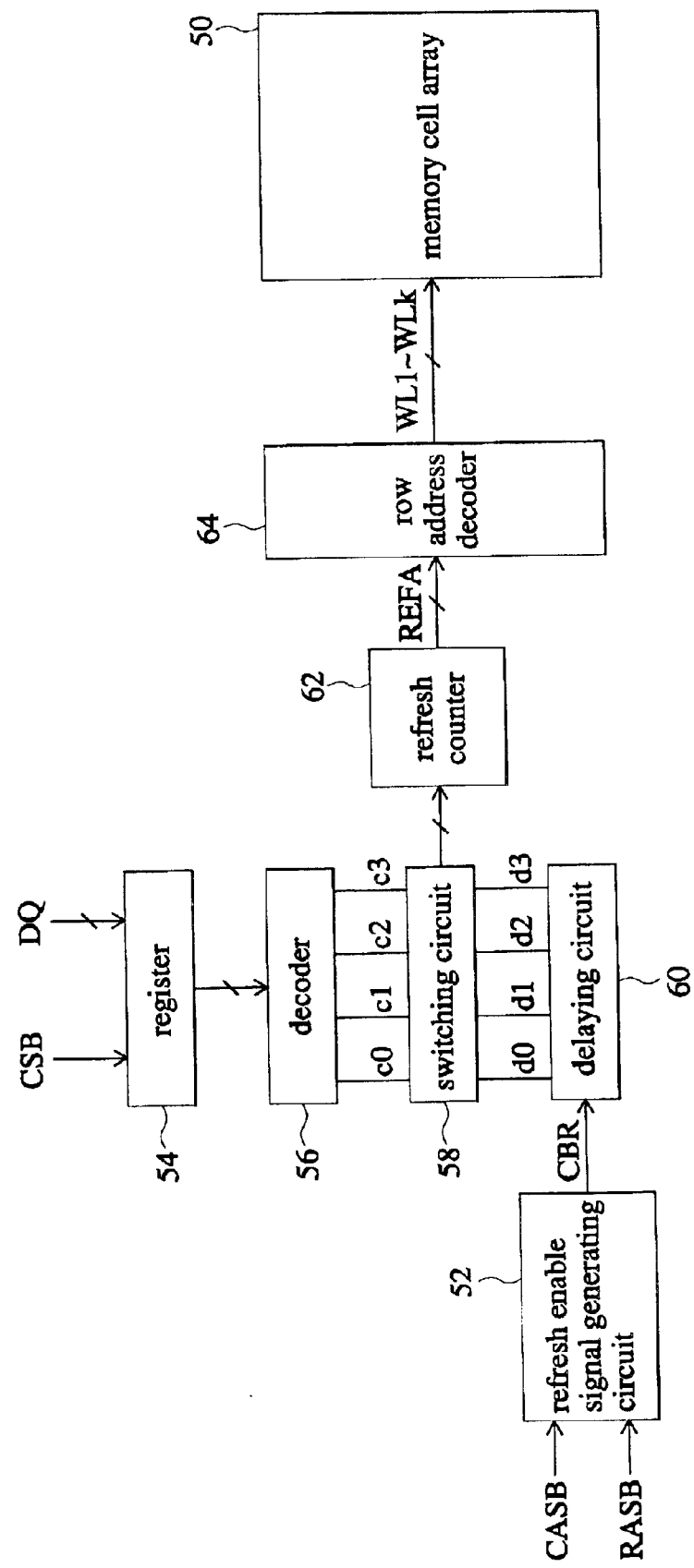
FIG. 6 is a block diagram showing circuitry for performing refresh operation of the system in accordance with an exemplary embodiment of the present invention.

FIG. 6 is a block diagram of a circuit for performing the refresh operation in accordance with an exemplary embodiment of the present invention. The circuit is formed in each of the dynamic semiconductor memory devices.

The circuit includes a memory cell array 50, a refresh enable signal generating circuit 52, a decoder 56, a switching circuit 58, a delaying circuit 60, refresh counter 62 and a row address decoder 64.

The refresh enable signal generating circuit 52 detects when the inverted column address strobe signal CASB is applied to the dynamic semiconductor memory device before the inverted row address signal RASB is applied, and generates a refresh enable signal CBR.

The register 54 stores the designated number. The register 54 is enabled in response to the inverted chip selection signal CSB and outputs the designated numbers designating the order for performing the refresh operation as the data DQ.

The decoder 56 decodes the designated numbers output from the register 54 and generates decoded signals c0, c1, c2, c3. The delaying circuit 60 generates delayed signals d0, d1, d2, d3 by delaying the refresh enable signal CBR to the extent of different time periods, respectively.

The switching circuit 58 transmits the delayed signals d0, d1, d2, d3 in response to the decoded signals c0, c1, c2, c3, respectively. The refresh counter 62 is enabled in response to signals transmitted by the switching circuit 58 and generates refresh address REFA. The row address decoder 64 generates word lines WL1–WLk by decoding the refresh address REFA.

Figure 7:
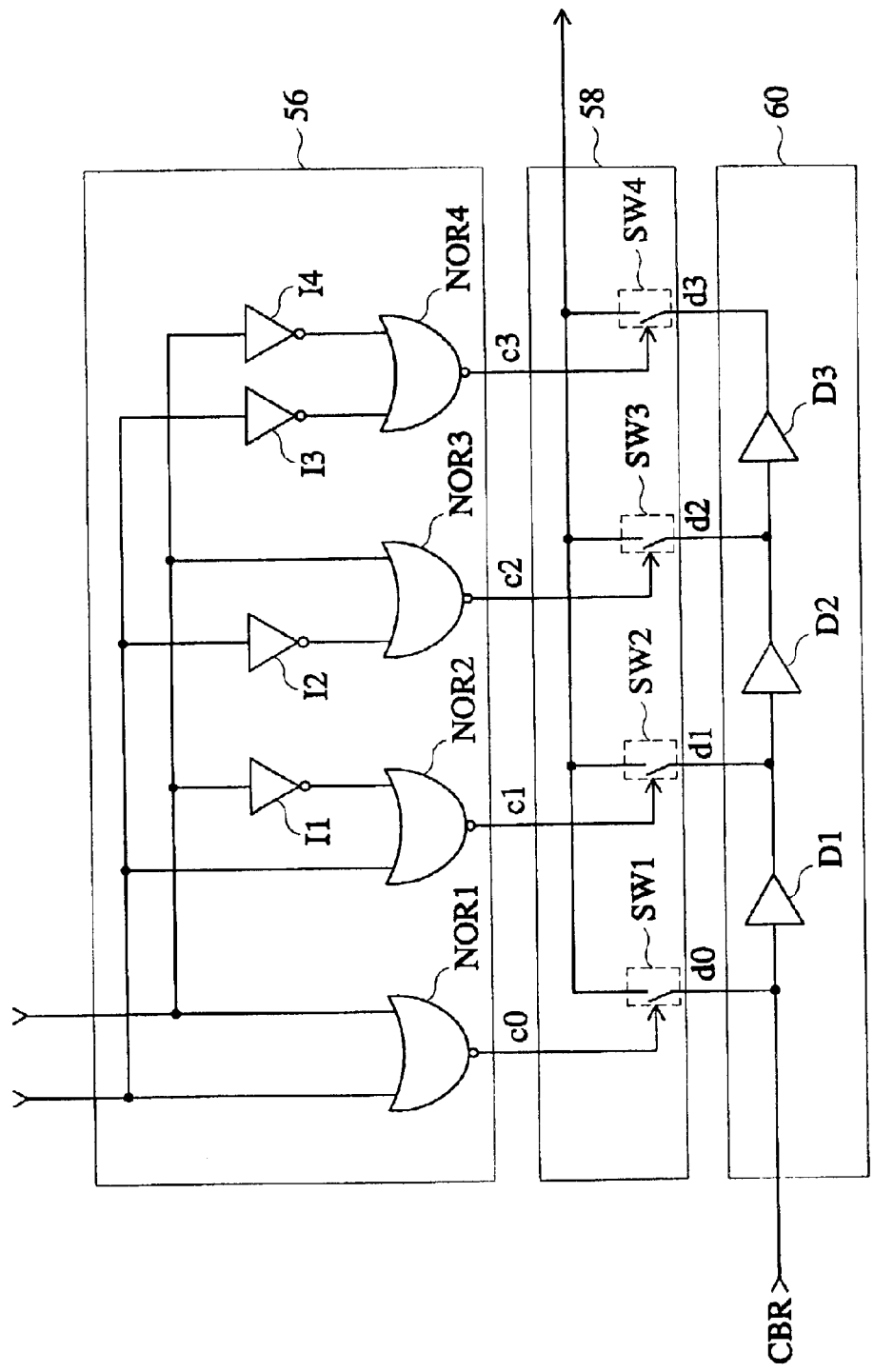
FIG. 7 is an exemplary circuit diagram of the circuitry including a decoder, a switching circuit and a delay circuit in accordance with an exemplary embodiment of the present invention.

FIG. 7 is an exemplary circuit diagram of a circuit including the decoder 56, the switching circuit 58 and the delaying circuit 60 shown in FIG. 6.

The decoder 56 includes inverters I1, I2, I3, I4 and NOR gates NOR1, NOR2, NOR3, NOR4. The switching circuit 58 includes four switches SW1, SW2, SW3, SW4 and the delaying circuit 60 includes delay elements D1, D2, D3.

FIG. 7 is a circuit diagram for a register 54 that stores a 2-bit designated number. When the register 54 stores the designated number "00", the decoder 56 generates the decoded signal c0 of a logic "high" level by decoding the designated number "00" through the NOR gate NOR1. Then, the switch SW1 in the switching circuit 58 is turned on and the delayed signal d0 is transmitted from the delaying circuit 60. Therefore, the refresh enable signal CBR is output from the internal circuit without delaying.

If the register 54 stores the designated number "01", the decoded signal c1 of a logic "high" level is output from the NOR gate NOR2 of the decoder 56 by decoding the designated number "01", and then the switch SW2 is turned on. Therefore, the delayed signal d1 is transmitted from the delaying circuit 60. That is, the refresh enable signal CBR delayed by the delaying elements D1 is output from the internal circuit.

If the register 54 stores the designated number "11", the NOR gate NOR4 of the decoder 56 generates the decoded signal c3 of a logic "high" level by decoding the designated number "11". Then, the switch SW4 is turned on and the delayed signal d3 is output. That is, the refresh enable signal CBR delayed by the delaying elements D1, D2 and D3 is output.

Accordingly, the dynamic semiconductor memory devices storing the designated number "00" is refreshed first and then refresh operation of the DRAM storing the designated number "01" follows. In the same way, the dynamic semiconductor memory devices storing the designated number "10" is refreshed before the dynamic semiconductor memory devices storing the designated number "11" is refreshed.

Therefore, in accordance with exemplary embodiments of the present invention, the dynamic semiconductor memory devices are not refreshed at the same time but refreshed in order of a designated number when the inverted column address strobe signal CASB is applied before the inverted row address strobe signal RASB. Accordingly, current flow is reduced during the refresh operation, and consequently noise is reduced. Therefore, electric characteristics of the system using a plurality of dynamic semiconductor memory devices are not deteriorated.

The exemplary embodiments of the present invention disclose a system having four slots for receiving four memory modules, and each of the memory modules include four dynamic semiconductor memory devices. However, exemplary embodiments of the present invention can be applied to a system having a plurality of memory modules each of which comprise other than four dynamic semiconductor memory devices. Further, exemplary embodiments of the present invention can be applied to a system having memory devices other than dynamic semiconductor memory devices.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. An electronic system, comprising:
    a plurality of dynamic semiconductor memory devices; and
    a controller for controlling the semiconductor memory devices,
    wherein each of the dynamic semiconductor memory devices includes:
    a storage device for storing designated numbers designating an order for performing a refresh operation, the designated numbers being supplied from the controller when the electronic system is initialized;
    a refresh enable signal generating circuit for generating a refresh enable signal in response to a refresh controlling command supplied from the controller; and
    delay means for delaying the refresh enable signal by different time intervals which are determined by the designated numbers.

2. The system of claim 1, wherein the delay means includes:
    a decoder for generating decoded signals by decoding the designated numbers;
    a delaying circuit for outputting delayed signals by delaying the refresh enable signal by the different time intervals; and
    a switching circuit for transmitting the refresh enable signal and one of the delayed signals in response to the decoded signals.

3. The system of claim 2, wherein the delaying circuit includes a plurality of delay elements connected in series, each of the delay elements receiving the refresh enable signal and generating a delayed signal delayed by the different time intervals.

4. The system of claim 1, wherein the controller supplies the designated number to the dynamic semiconductor memory devices through data input output signal lines of the dynamic semiconductor memory devices.

5. The electronic system of claim 1, wherein the plurality of dynamic semiconductor memory devices are dynamic random access memories (DRAM).

6. An electronic system, comprising:
    a plurality of dynamic semiconductor memory devices; and
    a controller for controlling the semiconductor memory devices,
    wherein each of the dynamic semiconductor memory devices includes:
    a storage device for storing a designated number designating an order for performing a refresh operation when the system is initialized;
    a decoder for generating a plurality of decoded signals by decoding the designated number;
    refresh enable signal generating means for generating a refresh enable signal in response to a refresh controlling command supplied from the controller;
    delaying means for delaying the refresh enable signal by a time interval which is determined by the designated number;
    switching means for transmitting the delayed refresh enable signal in response to the decoded signals; and
    refresh address generating means for generating a refresh address in response to an output signal output from the switching means.

7. The system of claim 6, wherein the delaying means includes a plurality of delay elements connected in series, the delay elements receiving the refresh enable signal and generating a plurality of delayed signals by delaying the refresh enable signal.

8. The system of claim 6, wherein the controller applies the designated number to the dynamic semiconductor memory devices through a plurality of corresponding data input output signal lines.

9. The electronic system of claim 6, wherein the plurality of dynamic semiconductor memory devices are dynamic random access memories (DRAM).

10. A method of refreshing an electronic system including a plurality of dynamic semiconductor memory devices and a controller for controlling operation of the dynamic semiconductor memory devices, comprising:
    storing a designated number designating an order for performing a refresh operation on each of the plurality of dynamic semiconductor memory devices; and
    performing the refresh operation on the plurality of dynamic semiconductor memory devices in an order related to the designated number when a refresh control command is applied from the controller during the refresh operation.

11. The method of claim 10, wherein performing the refresh operation includes:
    generating a plurality of decoded signals by decoding each of the designated numbers;
    generating a plurality of delayed signals by delaying the refresh control command by different time intervals;
    outputting the delayed signals in response to the decoded signals, respectively.

12. An electronic system for performing the method of claim 10.

* * * * *